(12) United States Patent
Ge et al.

(10) Patent No.: US 9,864,524 B2
(45) Date of Patent: Jan. 9, 2018

(54) CIRCUIT THAT SELECTS EPROMS INDIVIDUALLY AND IN PARALLEL

(71) Applicant: HEWLETT-PACKARD DEVELOPMENT COMPANY, L.P., Houston, TX (US)

(72) Inventors: Ning Ge, Singapore (SG); Paul I. Mikulan, Carrollton, TX (US); Bee Ling Peh, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/416,813

(22) Filed: Jan. 26, 2017

(65) Prior Publication Data
US 2017/0147212 A1    May 25, 2017

Related U.S. Application Data

(62) Division of application No. 14/343,133, filed as application No. PCT/US2011/053488 on Sep. 27, 2011, now Pat. No. 9,592,664.

(51) Int. Cl.
G11C 16/04 (2006.01)
G06F 3/06 (2006.01)
B41J 2/045 (2006.01)

(52) U.S. Cl.
CPC .......... *G06F 3/061* (2013.01); *B41J 2/04541* (2013.01); *B41J 2/04586* (2013.01); *G06F 3/0655* (2013.01); *G06F 3/0688* (2013.01)

(58) Field of Classification Search
CPC ............ G11C 16/0416; G11C 16/0425; G11C 16/102; G11C 17/143; G11C 17/146; G11C 17/16; H01L 27/11517; H01L 27/115; B41J 2/04541; B41J 2/17546; B41J 2/17543; B41J 2202/13; B41J 2202/17
See application file for complete search history.

(56) References Cited

U.S. PATENT DOCUMENTS

| 5,172,338 A | 12/1992 | Mehrotra et al. |
| 6,056,455 A | 5/2000 | Klaus et al. |
| 6,226,201 B1 | 5/2001 | Madurawe et al. |

(Continued)

FOREIGN PATENT DOCUMENTS

| CN | 1334548 | 2/2002 |
| CN | 1755934 | 4/2006 |

(Continued)

OTHER PUBLICATIONS

European Patent Office, European Search Report dated May 27, 2015, Application No. 11873357.5 (6 pages).
Korean Intellectual Property Office, Transmittal of International Search Report and Written Opinion for PCT/US2011/053488 dated May 8, 2012 (8 pages).

*Primary Examiner* — Andrew Q Tran
(74) *Attorney, Agent, or Firm* — Dicke, Billig & Czaja, PLLC (PAT)

(57) ABSTRACT

An integrated circuit including a first EPROM, a second EPROM, and a circuit. The first EPROM is configured to provide a first state and a second state. The second EPROM is configured to provide a third state and a fourth state. The circuit is configured to select the first EPROM and the second EPROM individually and in parallel with each other.

19 Claims, 8 Drawing Sheets

(56) References Cited

U.S. PATENT DOCUMENTS

| | | | |
|---|---|---|---|
| 6,325,483 B1 * | 12/2001 | Harbour | B41J 2/17503 |
| | | | 347/14 |
| 7,267,415 B2 | 9/2007 | Saruta | |
| 7,365,387 B2 * | 4/2008 | Benjamin | B41J 2/04541 |
| | | | 257/317 |
| 7,522,072 B1 | 4/2009 | Wu | |
| 7,684,227 B2 | 3/2010 | Liu et al. | |
| 8,460,947 B2 * | 6/2013 | Leigh | B41J 2/14072 |
| | | | 257/E21.521 |
| 8,864,260 B1 * | 10/2014 | Ge | B41J 2/04541 |
| | | | 347/9 |
| 2003/0052745 A1 | 3/2003 | Thompson et al. | |
| 2007/0194371 A1 | 8/2007 | Benjamin | |
| 2010/0202205 A1 | 8/2010 | Ito et al. | |
| 2010/0265773 A1 | 10/2010 | Lung et al. | |
| 2010/0301404 A1 | 12/2010 | Kawashima | |

FOREIGN PATENT DOCUMENTS

| | | |
|---|---|---|
| CN | 1941381 | 4/2007 |
| CN | 101390196 | 3/2009 |
| CN | 101901809 | 12/2010 |
| KR | 20080106909 | 12/2008 |
| TW | 436794 | 5/2001 |
| WO | WO-2007053219 | 5/2007 |
| WO | WO-2010077408 | 7/2010 |

\* cited by examiner

CIRCUIT THAT SELECTS EPROMS INDIVIDUALLY AND IN PARALLEL

CROSS-REFERENCE TO RELATED APPLICATIONS

This patent application is a divisional of Ser. No. 14/343,133 filed Mar. 6, 2014, U.S. Pat. No. 9,592,664, which is a 371 national stage of PCT/US2011/053488 with international filing date of Sep. 27, 2011, entitled "CIRCUIT THAT SELECTS EPROMS INDIVIDUALLY AND IN PARALLEL," which is incorporated herein by reference.

BACKGROUND

In inkjet printheads, fuse technology has been used in N-channel metal-oxide semiconductor (NMOS) chips. In these NMOS chips, fuses are selectively burned to program a bit. However, fuse technology and programming fuses in this way has drawbacks. Fuses are relatively large and fuses can be unreliable. Also, burning fuses can damage the orifice layer of the inkjet during programming and after a fuse burns out metal debris from the fuse can be drawn into the ink and cause blockage in the inkjet pen, resulting in poor quality printing.

In recent years, erasable programmable read-only memory (EPROM) devices have been developed. These EPROM devices include a conductive grid of rows and columns, without fuses. Instead, a memory cell is located at each row/column intersection. Each memory cell includes a transistor structure and two gates that are separated from each other by a thin dielectric layer. One of the gates is a floating gate and the other is a control gate or input gate. In an un-programmed memory cell, the floating gate has no charge, which causes the threshold voltage to be low. In a programmed memory cell, the floating gate is charged with electrons and the threshold voltage is higher. To program a memory cell, a programming voltage (e.g., 10 to 16 volts) is applied to the control gate and drain. This programming voltage draws excited electrons to the floating gate, thereby increasing the threshold voltage. A memory cell having a lower threshold voltage is one logic value and a memory cell having a higher threshold voltage is the other logic value.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that features of the various embodiments described herein may be combined with each other unless specifically noted otherwise.

EPROM can be used in inkjet printheads to store identification (ID) information. As smart features are added to printers and as security requirements increase, more EPROM cells are needed to store the related information. This ID information may include product type, serial number, ink drop weight, and customer loyalty/authentication information. However, increasing the number of EPROM cells on a printhead integrated circuit die, either reduces the amount of real estate available on the printhead die for other functions or it leads to increasing the size of the printhead die or both, which increases the cost of the printhead. For these and other reasons there is a need for the invention described herein.

Figure 1:
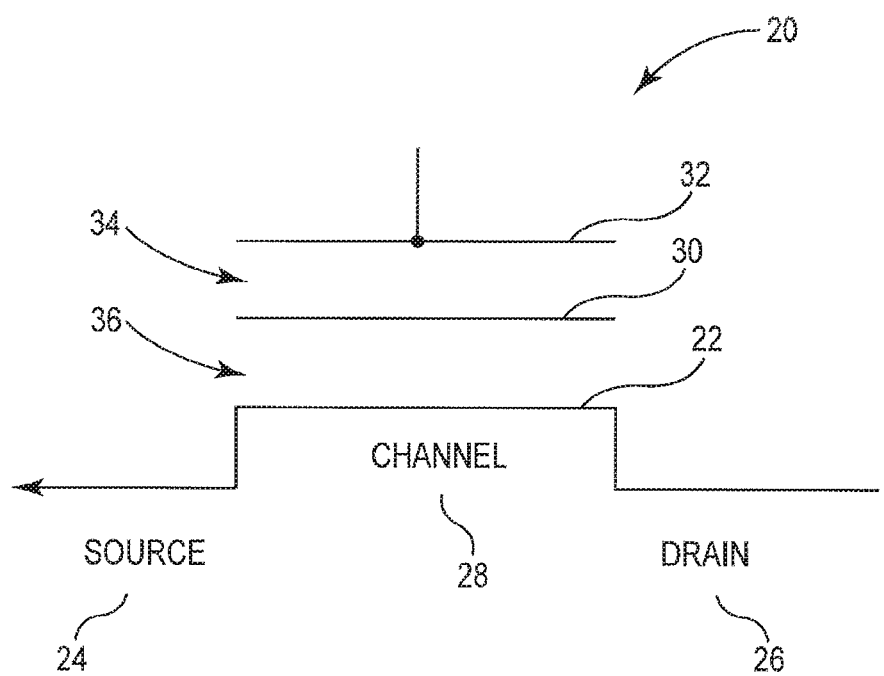
FIG. 1 is a diagram illustrating one example of an EPROM cell.

FIG. 1 is a diagram illustrating one example of an EPROM cell 20 that does not include a fuse and provides a number of advantages over a fused bit. EPROM cells, such as EPROM cell 20, can be used to eliminate fuses in systems, such as inkjet printhead systems.

EPROM cell 20 includes a semiconductor substrate 22 having a source 24, a drain 26, and a channel 28, where channel 28 is situated between source 24 and drain 26. A floating gate 30 is situated over channel 28 and an input gate 32, also referred to as control gate 32, is situated over floating gate 30. Source 24 includes an N+ doped region and drain 26 includes an N+ doped region. Channel 28 is a p doped region situated between the N+ doped regions of source 24 and drain 26.

Control gate 32 is capacitively coupled to floating gate 30 via a dielectric material 34 that is situated between control gate 32 and floating gate 30. A voltage at control gate 32 is coupled to floating gate 30. Another layer of dielectric material 36 is disposed between floating gate 30 and substrate 22 over channel 28.

To program EPROM cell 20, a high voltage bias is applied to drain 26. This high voltage bias on drain 26 generates energetic "hot" carriers or electrons. A positive voltage bias between control gate 32 and drain 26 pulls some of these hot electrons onto floating gate 30. As electrons are pulled onto floating gate 30, the threshold voltage of EPROM cell 20, i.e., the voltage required to cause channel 28 to conduct current, increases. If enough electrons are pulled onto floating gate 30, the threshold voltage increases to a level above a specified threshold voltage and EPROM cell 20 substantially blocks current at the specified threshold voltage level, which changes the logic state of EPROM cell 20 from one logic value to the other logic value. Thus, EPROM cell 20 is programmed via hot carrier injection onto floating gate 30. In normal operation, a sensor (not shown) is used to detect the state of EPROM cell 20.

Figure 2:
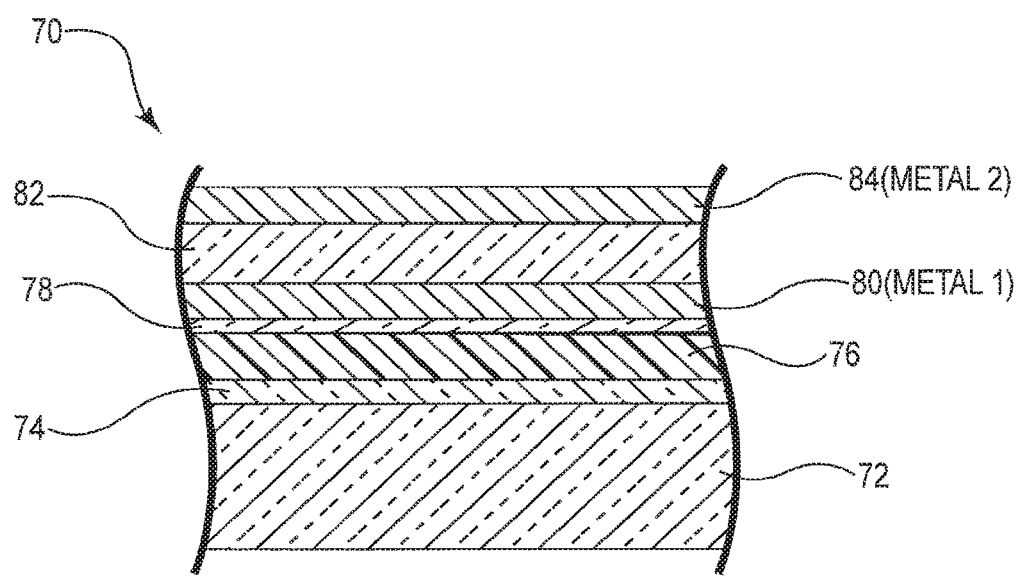
FIG. 2 is a diagram illustrating one example of the layers in an EPROM chip.

FIG. 2 is a diagram illustrating one example of the layers in an EPROM chip 70. In one example, EPROM chip 70 includes EPROM cells such as EPROM cell 20 of FIG. 1. In one example, EPROM chip 70 is used in an inkjet printhead. In one example, EPROM chip 70 is an inkjet control chip including EPROM. In one example, EPROM chip 70 is an inkjet printhead die including EPROM.

EPROM chip 70 includes a semiconductor substrate 72, an oxide layer 74, a polysilicon layer 76, a first dielectric layer 78, a metal 1 layer 80, a second dielectric layer 82, and a metal 2 layer 84. Oxide layer 74 is disposed on substrate 72 between substrate 72 and polysilicon layer 76. First dielectric layer 78 is disposed on polysilicon layer 76 between polysilicon layer 76 and metal 1 layer 80. Second dielectric layer 82 is disposed on metal 1 layer 80 and separates metal 1 layer 80 from metal 2 layer 84. Metal 1 layer 80 and metal 2 layer 84 provide addressing lines, such as row lines and column lines, and other connections in EPROM chip 70. In one example, oxide layer 74 is silicon dioxide (SiO2). In one example, second dielectric layer 82 includes silicon nitride. In one example, second dielectric layer 82 includes silicon carbide. In one example, second dielectric layer 82 includes silicon nitride and silicon carbide.

Figure 3:
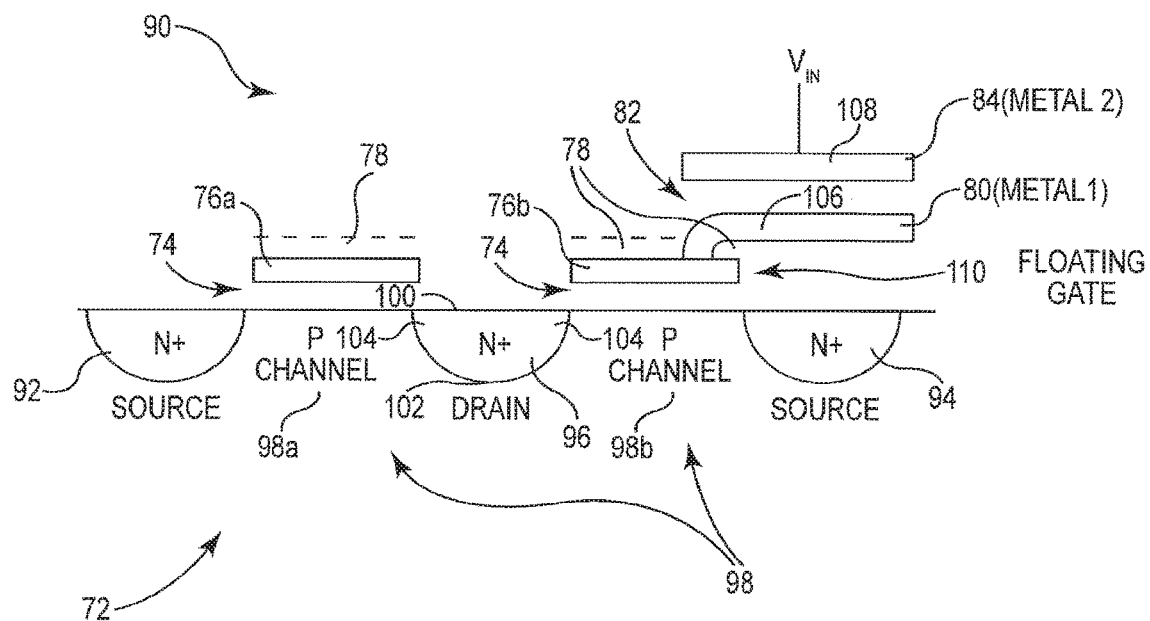
FIG. 3 is a diagram illustrating one example of an EPROM cell that uses the layers of the EPROM chip of FIG. 2.

FIG. 3 is a diagram illustrating one example of an EPROM cell 90 that uses the layers of EPROM chip 70 of FIG. 2. In one example, EPROM cell 20 of FIG. 1 is similar to EPROM cell 90. In one example, EPROM cell 90 is used in an inkjet printhead system. In one example, EPROM cell 90 is used in an inkjet control chip. In one example, EPROM cell 90 is used in an inkjet printhead die. In other examples, EPROM cell 90 is created using the layers of a different process.

EPROM cell 90 includes substrate 72 that has N+ source regions 92 and 94, an N+ drain region 96, and a p channel 98 that includes p channel regions 98a and 98b. Drain region 96 includes a top surface 100, a bottom 102, and sides 104 between top surface 100 and bottom 102. Channel 98, including channel regions 98a and 98b, surrounds drain region 96 around the sides 104 of drain region 96. Channel 98 is situated between source region 92 and drain region 96 and between source region 94 and drain region 96. In one example, source regions 92 and 94 are connected and part of one continuous source region that surrounds channel 98.

Channel 98 includes a closed curve structure around drain region 96, where a curve is defined as an object similar to a line, but not required to be straight, which entails that a line is a special case of a curve, namely a curve with null curvature. Also, a closed curve is defined as a curve that joins up and has no endpoints. In one example, channel 98 includes a rounded closed curve structure around drain region 96, where a rounded closed curve is a closed curve that has at least one rounded or arched corner or no corners, such that it does not have sharp or angled corners. In one example, channel 98, including channel regions 98a and 98b, is a rectangular shaped channel around drain region 96. In one example, channel 98, including channel regions 98a and 98b, is an elliptically shaped channel around drain region 96. In one example, channel 98, including channel regions 98a and 98b, is a circular shaped channel around drain region 96. In one example, channel 98, including channel regions 98a and 98b, has multiple straight sides and at least one rounded corner to form a rounded closed curve channel around drain region 96. In one example, channel 98, including channel regions 98a and 98b, has at least one rounded exterior corner to form a rounded closed curve channel around drain region 96. In one example, channel 98, including channel regions 98a and 98b, has at least one rounded exterior corner and at least one rectangular interior corner to form a rounded closed curve channel around drain region 96.

Rounded closed curve structures increase the uniformity of the length of the channel throughout the width of the channel, relative to a rectangular channel. Increasing the uniformity of the length of the channel, increases the uniformity of the generation of hot carriers and improves programming efficiency of the EPROM cell. One example channel includes a substantially uniform channel length throughout the width of the channel.

EPROM cell 90 includes capacitive coupling between metal 1 layer 80 and metal 2 layer 84, where metal 1 layer 80 and metal 2 layer 84 form parallel opposing capacitor plates 106 and 108. One capacitor plate 106 is formed in metal 1 layer 80 and the other capacitor plate 108 is formed in metal 2 layer 84. The capacitor plate 108 formed in metal 2 layer 84 is the control gate 108 of EPROM cell 90. The input voltage Vin is applied to control gate 108 and capacitively coupled to the capacitor plate 106. In one example, control gate 108 is similar to control gate 32 (shown in FIG. 1).

A parallel floating gate 110 is formed in polysilicon layer 76, where floating gate 110 includes polysilicon floating gate regions 76a and 76b situated over channel regions 98a and 98b, respectively. Floating gate 100, including floating gate regions 76a and 76b, forms a closed curve floating gate, such that floating gate 110 and channel 98 include closed curve structures. In one example, floating gate 110, including floating gate regions 76a and 76b, is the same shape as channel 98, including channel regions 98a and 98b.

A break or hole in dielectric layer 78 allows capacitor plate 106 in metal 1 layer 80 to be electrically coupled to floating gate 110, including floating gate regions 76a and 76b. Floating gate 110 is separated from substrate 72 by dielectric layer 74. In one example, dielectric layer 74 is a silicon dioxide layer between channel 98 and floating gate 110.

Floating gate 110, including floating gate regions 76a and 76b, includes a closed curve structure, where a curve is defined as an object similar to a line, but not required to be straight, which entails that a line is a special case of a curve, namely a curve with null curvature. Also, a closed curve is defined as a curve that joins up and has no endpoints. In one example, floating gate 110, including floating gate regions 76a and 76b, includes a rounded closed curve structure, where a rounded closed curve is a closed curve that has at least one rounded or arched corner or no corners, such that it does not have sharp or angled corners. In one example, floating gate 110 is a rectangular shaped floating gate. In one example, floating gate 110 is an elliptically shaped floating gate. In one example, floating gate 110 is a circular shaped floating gate. In one example, floating gate 110 has multiple straight sides and at least one rounded corner to form a rounded closed curve floating gate. In one example, floating gate 110 has at least one rounded exterior corner to form a rounded closed curve floating gate. In one example, floating gate 110 has at least one rounded exterior corner and at least one rectangular interior corner to form a rounded closed curve floating gate.

Rounded closed curve structures increase the uniformity of the length of the floating gate throughout the width of the floating gate, relative to a rectangular floating gate. Increasing the uniformity of the length of the floating gate, increases the uniformity of the generation of hot carriers and improves programming efficiency of the EPROM cell. One example floating gate includes a substantially uniform floating gate length throughout the width of the floating gate.

To program EPROM cell 90, a high input voltage pulse is applied to control gate 108 and drain region 96, across drain region 96 to source regions 92 and 94. This generates energetic "hot" carriers or electrons. A positive voltage bias between control gate 108 and drain region 96 pulls some of these hot electrons onto floating gate 110. As electrons are pulled onto floating gate 110, the threshold voltage of EPROM cell 90, i.e., the voltage required to cause channel 98 to conduct current, increases. If enough electrons are pulled onto floating gate 110, the threshold voltage increases to a level above a specified threshold voltage and EPROM cell 90 substantially blocks current at a specified threshold voltage level, which changes the logic state of EPROM cell 90 from one logic value to the other logic value. Thus, EPROM cell 90 is programmed via hot carrier injection onto floating gate 110.

To read or sense the state of EPROM cell 90, the threshold voltage is detected and/or the on resistance is measured using a sensor (not shown). Reading or sensing the state of EPROM cell 90 can be done by setting the gate/drain voltage and measuring the corresponding current or by setting the current and measuring the voltage. The measured on resistance of EPROM cell 90 changes by a factor of about 2 from an un-programmed state to a programmed state.

Figure 4:
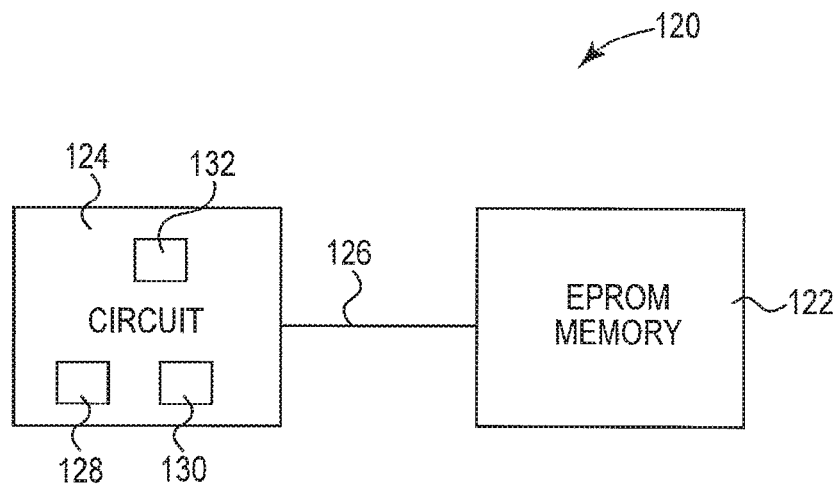
FIG. 4 is a diagram illustrating one example of a system that includes an EPROM memory and an associated circuit.

FIG. 4 is a diagram illustrating one example of a system 120 including an EPROM memory 122 and an associated circuit 124. EPROM memory 122 is communicatively coupled to circuit 124 via memory path 126. In one example, EPROM memory 122 is electrically coupled to circuit 124 via memory path 126. In one example, system 120 is part of an inkjet printhead system. In one example, system 120 is part of an inkjet control chip. In one example, system 120 is part of an inkjet printhead die.

EPROM memory 122 includes EPROM cells that can be selected and programmed individually and selected and read individually and in parallel combinations of the EPROM cells. In one example, each of the EPROM cells stores one of an un-programmed state and a programmed state. In one example, EPROM memory 122 includes EPROM cells similar to EPROM cell 20 of FIG. 1. In one example, EPROM memory 122 includes EPROM cells similar to EPROM cell 90 of FIG. 3. In one example, EPROM memory 122 includes a type of EPROM cell manufactured using the layers of EPROM chip 70 of FIG. 2, where one transistor is an EPROM transistor and another transistor operates as the control gate for the EPROM transistor. In one example, EPROM memory 122 includes a type of EPROM cell manufactured using another process and different layers than those of EPROM chip 70 of FIG. 2.

Circuit 124 selects EPROM cells in EPROM memory 122 individually or in parallel combinations of EPROM cells to program and read the EPROM cells via memory path 126. Circuit 124 includes a programming circuit 128, a measurement circuit 130, and a voltage supply 132. To program an EPROM cell in EPROM memory 122, circuit 124 selects one of the EPROM cells and programming circuit 128 controls voltage supply 132 to provide a programming voltage to the selected EPROM cell. To read EPROM memory 122, circuit 124 selects one of the EPROM cells individually or a parallel combination of EPROM cells and measurement circuit 130 controls voltage supply 132 to measure the on resistance of the selected EPROM cell or the selected parallel combination of EPROM cells. Circuit 124 assigns a corresponding state to the measured resistance value.

Figure 5:
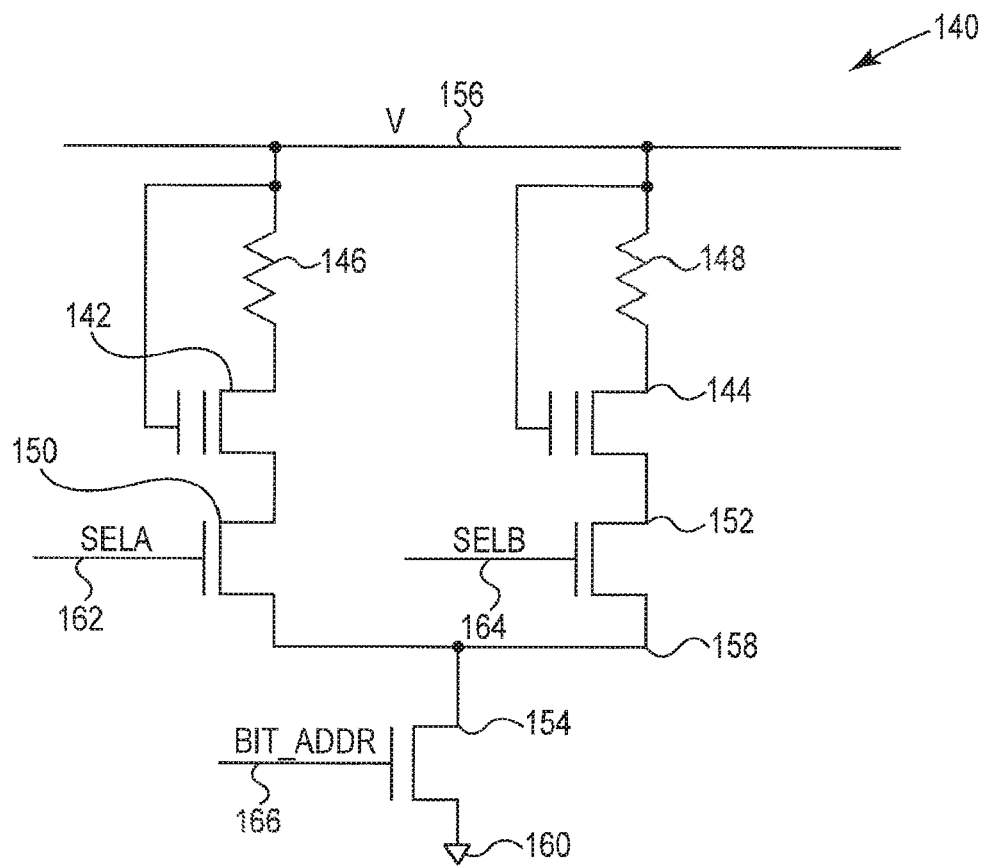
FIG. 5 is a diagram illustrating one example of an EPROM bit in an EPROM memory.

FIG. 5 is a diagram illustrating one example of an EPROM bit 140 in EPROM memory 122. EPROM bit 140 includes a first EPROM 142 and a second EPROM 144. Each of the first EPROM 142 and the second EPROM 144 has an un-programmed state and a programmed state, where each state of the first EPROM 142 and the second EPROM 144 has a different on resistance value than the other three states. Circuit 124 (shown in FIG. 4) selects first EPROM 142 and second EPROM 144 individually or in parallel to program and read up to eight different states from EPROM bit 140. In one aspect, EPROM bit 140 is a multiple level (multilevel) EPROM bit 140. In another example, each of the first EPROM 142 and the second EPROM 144 has more than two states, where each state of the first EPROM 142 and the second EPROM 144 has a different on resistance value than the other states of the first EPROM 142 and the second EPROM 144 and circuit 124 selects first EPROM 142 and second EPROM 144 individually or in parallel to program and read up to greater than eight states from EPROM bit 140. In other examples, EPROM bit 140 includes more than two EPROMs, where each state of the more than two EPROMs has a different on resistance value than the other states of the more than two EPROMs and circuit 124 selects the more than two EPROMs individually or in parallel to program and read up to greater than eight different states from EPROM bit 140.

EPROM bit 140 includes a first resistor 146, a second resistor 148, first EPROM 142, second EPROM 144, a first select transistor 150, a second select transistor 152, and a bit address transistor 154. One end of first resistor 146 is electrically coupled to voltage supply 132 via voltage supply path 156 and the other end of first resistor 146 is electrically coupled to the drain of first EPROM 142. The gate of first EPROM 142 is electrically coupled to voltage supply 132 via voltage supply path 156 and the source of first EPROM 142 is electrically coupled to the drain of first select transistor 150. The source of first select transistor 150 is electrically coupled to the drain of bit address transistor 154 via drain path 158. The source of bit address transistor 154 is electrically coupled to a reference, such as ground, at 160. One end of second resistor 148 is electrically coupled to voltage supply 132 via voltage supply path 156 and the other end of second resistor 148 is electrically coupled to the drain of second EPROM 144. The gate of second EPROM 144 is electrically coupled to voltage supply 132 via voltage supply path 156 and the source of second EPROM 144 is electrically coupled to the drain of second select transistor 152. The source of second select transistor 152 is electrically coupled to the drain of bit address transistor 154 via drain path 158.

Each of the first EPROM 142 and the second EPROM 144 has an un-programmed state and a programmed state and each state of the first EPROM 142 and the second EPROM 144 has a different on resistance than the other three states of the first EPROM 142 and the second EPROM 144. First EPROM 142 has a first un-programmed resistance and a first programmed resistance and second EPROM 144 has a second un-programmed resistance and a second programmed resistance, where each resistance of the first un-programmed resistance, the first programmed resistance, the second un-programmed resistance, and the second programmed resistance is a different resistance value than each of the other three resistances. In one example, first EPROM 142 has a first channel width and second EPROM 144 has a second channel width that is different than the first channel width to provide the different resistance values. In one example, first EPROM 142 is a first type of EPROM and second EPROM 144 is a second type of EPROM to provide the different resistance values, where different types of EPROMs include EPROM cell 90 of FIG. 3, an EPROM manufactured using the layers of EPROM chip 70 of FIG. 2 where one transistor is an EPROM transistor and another transistor operates as the control gate for the EPROM transistor, and an EPROM manufactured using another process and different layers than those of EPROM chip 70 of FIG. 2.

Circuit 124 (shown in FIG. 4) selects first EPROM 142 and second EPROM 144 individually or in parallel to program and read the states of EPROM bit 140. To select only first EPROM 142, circuit 124 simultaneously provides a high select signal SELA at 162, a low select signal SELB at 164, and a high bit address signal BIT_ADDR at 166. To select only second EPROM 144, circuit 124 simultaneously provides a low select signal SELA at 162, a high select signal SELB at 164, and a high bit address signal BIT_ADDR at 166. To select the parallel combination of the first EPROM 142 and the second EPROM 144, circuit 124 simultaneously provides a high select signal SELA at 162, a high select signal SELB at 164, and a high bit address signal BIT_ADDR at 166. In one example, circuit 124 combines row and column addresses to provide bit address signal BIT_ADDR at 166.

Circuit 124 programs first EPROM 142 and second EPROM 144 individually. To program first EPROM 142, circuit 124 selects only first EPROM 142 and programming circuit 128 controls voltage supply 132 to provide a programming voltage V at 156 to first EPROM 142. Current flows through first resistor 146, first EPROM 142, first select transistor 150, and bit address transistor 154 to the reference at 160. To program second EPROM 144, circuit 124 selects only second EPROM 144 and programming circuit 128 controls voltage supply 132 to provide a programming voltage V at 156 to second EPROM 144. Current flows through second resistor 148, second EPROM 144, second select transistor 152, and bit address transistor 154 to the reference at 160. Bit address transistor 154 conducts current from each of the first EPROM 142 and the second EPROM 144 via drain path 158. In other examples, circuit 124 can program first EPROM 142 and second EPROM 144 in parallel.

Circuit 124 reads EPROM bit 140 by selecting and reading first EPROM 142 and second EPROM 144 individually or in parallel. Circuit 124 selects one of the first EPROM 142, the second EPROM 144, and the parallel combination of the first EPROM 142 and the second EPROM 144, and measurement circuit 130 controls voltage supply 132 to provide voltage V at 156. Measurement circuit 130 measures the on resistance through the selected one of the first EPROM, the second EPROM, and the parallel combination of the first EPROM and the second EPROM. Circuit 124 assigns a corresponding state to the measured resistance value.

EPROM bit 140 stores up to eight different states using first EPROM 142 and second EPROM 144, as shown in TABLE I.

TABLE I

| FIRST EPROM | SECOND EPROM | MEASURED RESISTANCE | STATE | RESISTANCE VALUES (Ohms) |
|---|---|---|---|---|
| Ra | X | Ra only | 0 | 3K |
| Ra' | X | Ra' only | 1 | 6K |
| X | Rb | Rb only | 2 | 4.5K |
| X | Rb' | Rb' only | 3 | 8K |
| Ra | Rb | Ra//Rb | 4 | 1.8K |
| Ra | Rb' | Ra//Rb' | 5 | 2181.8 |
| Ra' | Rb | Ra'//Rb | 6 | 2571.4 |
| Ra' | Rb' | Ra'//Rb' | 7 | 3428.6 |

In operation, circuit 124 sets first EPROM 142 to one of a first un-programmed resistance Ra and a first programmed resistance Ra' and second EPROM 144 to one of a second un-programmed resistance Rb and a second programmed resistance Rb', where each resistance of the first un-programmed resistance Ra, the first programmed resistance Ra', the second un-programmed resistance Rb, and the second programmed resistance Rb' is different than each of the other three resistances.

States 0 and 1 are provided by only first EPROM 142. For state 0, first EPROM 142 is set to the first un-programmed resistance Ra and second EPROM 144 is set to either second un-programmed resistance Rb or second programmed resistance Rb'. For state 1, first EPROM 142 is set to the first programmed resistance Ra' and second EPROM 144 is set to either second un-programmed resistance Rb or second programmed resistance Rb'.

States 2 and 3 are provided by only second EPROM 144. For state 2, second EPROM 144 is set to second un-programmed resistance Rb and first EPROM 142 is set to either first un-programmed resistance Ra or first programmed resistance Ra'. For state 3, second EPROM 144 is set to second programmed resistance Rb' and first EPROM 142 is set to either first un-programmed resistance Ra or first programmed resistance Ra'.

States 4 through 7 are provided by the parallel combination of first EPROM 142 and second EPROM 144. For state 4, first EPROM 142 is set to first un-programmed resistance Ra and second EPROM 144 is set to second un-programmed resistance Rb. For state 5, first EPROM 142 is set to first un-programmed resistance Ra and second EPROM 144 is set to second programmed resistance Rb'. For state 6, first EPROM 142 is set to first programmed resistance Ra' and second EPROM 144 is set to second un-programmed resistance Rb. For state 7, first EPROM 142 is set to first programmed resistance Ra' and second EPROM 144 is set to second programmed resistance Rb'.

To read only first EPROM 142 for states 0 and 1, circuit 124 selects only first EPROM 142 and measurement circuit 130 controls voltage supply 132 to provide voltage V to EPROM bit 140. Current flows through first resistor 146, first EPROM 142, first select transistor 150, and bit address transistor 154 to the reference at 160. Measurement circuit 130 measures the on resistance through first EPROM 142. The measured on resistance corresponds to one of the states of 0 and 1. The resistance values of states 0 and 1 depend on design and process variations. In the example illustrated in TABLE I, state 0 is 3000 Ohms and state 1 is 6000 Ohms. In other examples, states 0 and 1 are different resistance values.

To read only second EPROM 144 for states 2 and 3, circuit 124 selects only second EPROM 144 and measurement circuit 130 controls voltage supply 132 to provide voltage V to EPROM bit 140. Current flows through second resistor 148, second EPROM 144, second select transistor 152, and bit address transistor 154 to the reference at 160. Measurement circuit 130 measures the on resistance through second EPROM 144. The measured on resistance corresponds to one of the states of 2 and 3. The resistance values of states 2 and 3 depend on design and process variations. In the example illustrated in TABLE I, state 2 is 4500 Ohms and state 3 is 8000 Ohms. In other examples, states 2 and 3 are different resistance values.

To read the parallel combination of the first EPROM and the second EPROM, circuit 124 selects the parallel combination of the first EPROM 142 and the second EPROM 144 and measurement circuit 130 controls voltage supply 132 to provide voltage V to EPROM bit 140. Current flows through first resistor 146, first EPROM 142, first select transistor 150, and bit address transistor 154 to the reference at 160 and current flows through second resistor 148, second EPROM 144, second select transistor 152, and bit address transistor 154 to the reference at 160. The measured on resistance corresponds to one of the states of 4 through 7. The resistance values of states 4 through 7 depend on design and process variations. In the example illustrated in TABLE I, state 4 is 1800 Ohms, state 5 is 2181.8 Ohms, state 6 is 2571.4 Ohms, and state 7 is 3428.6 Ohms. In other examples, states 4 through 7 are different resistance values.

To read the different states of EPROM bit 140, a user has to know or obtain information that indicates whether to select only first EPROM 142 or only second EPROM 144 or the parallel combination of first EPROM 142 and second EPROM 144. This information is referred to as a coding scheme. In one example, at least part of the coding scheme is fixed and known by the user, such that each bit in a fixed portion of EPROM memory 122 is read by selecting only the first EPROM or only the second EPROM or only the parallel combinations of the EPROMs. In one example, at least part of the coding scheme is stored in another EPROM memory or in another integrated circuit die. In one example, at least part of the coding scheme is stored on a central server that may be accessed over the internet. In one example, at least part of the coding scheme is stored in EPROM memory 122, such as in a select only the parallel combination portion of EPROM memory 122.

Figure 6:
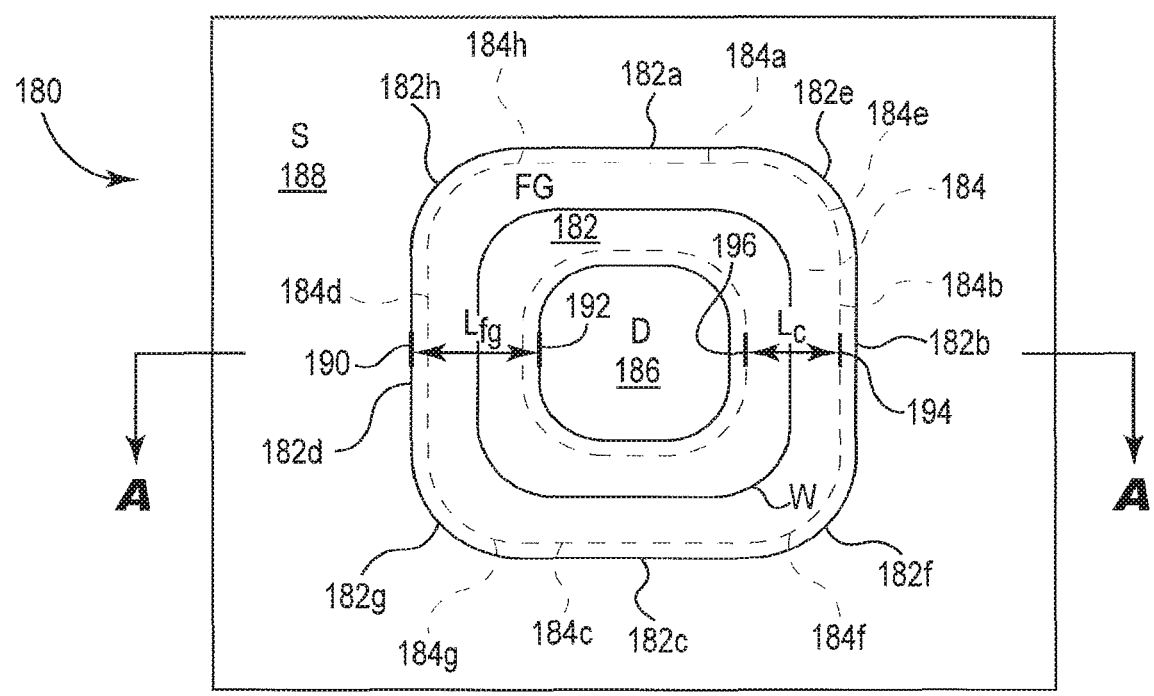
FIG. 6 is a top-view diagram illustrating one example of an EPROM cell that has a channel width W.

FIG. 6 is a top-view diagram illustrating one example of an EPROM cell 180 that has a channel width W and a drain to source on resistance that is inversely proportional to the channel width W and inversely proportional to the channel width W divided by the channel length Lc. In EPROM cell 180, a longer channel width W provides a smaller on resistance, and a shorter channel width W provides a larger on resistance, all else equal. Also, in EPROM cell 180, the relationship between the drain to source on resistance and channel width W is non-linear.

EPROM cell 180 includes a floating gate 182 having multiple straight sides 182a-182d and rounded corners 182e-182h, and a channel 184 having multiple straight sides 184a-184d and rounded corners 184e-184h. Channel 184 is situated under floating gate 182 and indicated by dotted lines. Also, some of the layers of EPROM cell 180, such as metal layers, are not shown for clarity. EPROM cell 180 is similar to EPROM cell 90 of FIG. 3. In one example, a cross-section of EPROM cell 180 taken along the line A-A is similar to the cross-section of EPROM cell 90 of FIG. 3.

EPROM cell 180 includes floating gate 182, channel 184, a drain 186, and a source 188. Channel 184 is situated under floating gate 182. Channel 184 surrounds drain 186 and is situated between drain 186 and source 188. Source 188 surrounds channel 184. In one example, floating gate 182 is polysilicon, channel 184 is a p channel region, drain 186 is an N+ region, and source 188 is an N+ region.

Floating gate 182 has four straight sides 182a-182d and four rounded corners 182e-182h. Floating gate 182 includes a rounded closed curve structure having rounded corners 182e-182h, such that it does not have sharp or angled corners. Floating gate 182 has a floating gate length Lfg that is the distance from the exterior side 190 of floating gate 182 to the interior side 192 of floating gate 182. The width W of floating gate 182 is the distance around floating gate 182 measured at the midpoint of the floating gate length Lfg. In other examples, floating gate 182 can have a different number of straight sides, such as two or three straight sides or more than four straight sides, and a different number of rounded corners, such as two or three rounded corners or more than four rounded corners.

Channel 184 has four straight sides 184a-184d and four rounded corners 184e-184h. Channel 184 includes a rounded closed curve structure having rounded corners 184e-184h, such that it does not have sharp or angled corners. Channel 184 has a channel length Lc that is the distance from the exterior side 194 of channel 184 to the interior side 196 of channel 184. The width W of channel 184 is the distance around channel 184 measured at the midpoint of the channel length Lc. In other examples, channel 184 can have a different number of straight sides, such as two or three straight sides or more than four straight sides, and a different number of rounded corners, such as two or three rounded corners or more than four rounded corners.

In one example, first EPROM 142 is similar to EPROM cell 180 and has a channel width W1 and second EPROM 144 is similar to EPROM cell 180 and has a channel width W2, where channel width W1 is longer than channel width W2 and the on resistance of first EPROM 142 is smaller than the on resistance of second EPROM 144. In one example, first EPROM 142 is similar to EPROM cell 180 and has a channel width W1 and second EPROM 144 is similar to EPROM cell 180 and has a channel width W2, where channel width W1 is longer than channel width W2 and first EPROM 142 has an un-programmed on resistance of 3000 Ohms and a programmed on resistance of 6000 Ohms and second EPROM 144 has an un-programmed on resistance of 4500 Ohms and a programmed on resistance of 8000 Ohms.

In other examples, each of first EPROM 142 and second EPROM 144 is similar to a metal oxide semiconductor field effect transistor (MOSFET) that does not have an enclosed drain structure, where first EPROM 142 has a channel width W1 and second EPROM 144 has a channel width W2 that is shorter than the channel width W1 and the drain to source on resistance of each MOSFET is inversely proportional to the channel width and inversely proportional to the channel width divided by the channel length, such that the on resistance of first EPROM 142 is smaller than the on resistance of second EPROM 144.

Figure 7:
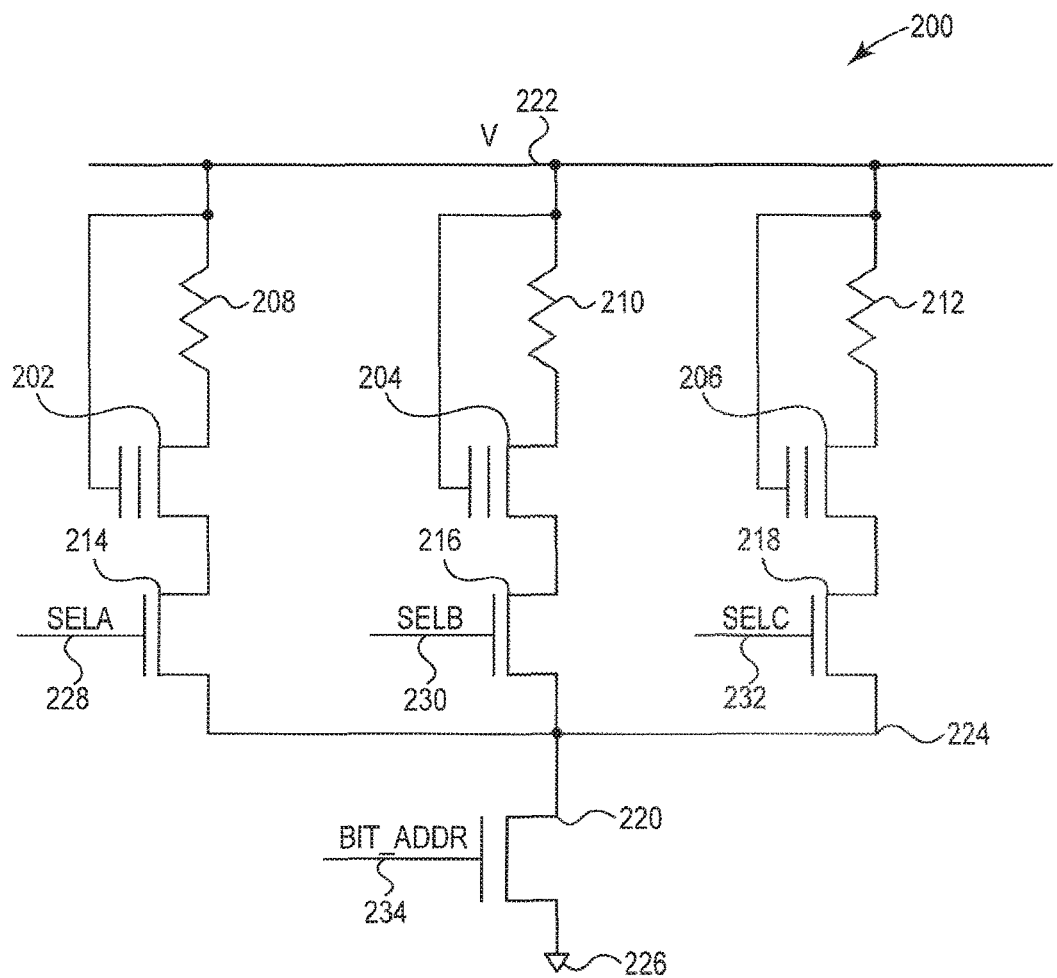
FIG. 7 is diagram illustrating one example of an EPROM bit in an EPROM memory.

FIG. 7 is a diagram illustrating one example of an EPROM bit 200 in EPROM memory 122 including a first EPROM 202, a second EPROM 204, and a third EPROM 206. Each of the first EPROM 202 and the second EPROM 204 and the third EPROM 206 has an un-programmed state and a programmed state, where each state of the first EPROM 202 and the second EPROM 204 and the third EPROM 206 has a different on resistance value than the other five states. Circuit 124 (shown in FIG. 4) selects first EPROM 202 and second EPROM 204 and third EPROM 206 individually or in parallel to program and read up to twenty six different states from EPROM bit 200. In one aspect, EPROM bit 200 is a multilevel EPROM bit 200. In another example, each of the first EPROM 202 and the second EPROM 204 and the third EPROM 206 has more than two states, where each state of the first EPROM 202 and the second EPROM 204 and the third EPROM 206 has a different on resistance value than the other states of the first EPROM 202 and the second EPROM 204 and the third EPROM 206 and circuit 124 selects first EPROM 202 and second EPROM 204 and third EPROM 206 individually or in parallel to program and read up to greater than twenty six states from EPROM bit 200. In other examples, EPROM bit 200 includes more than three EPROMs, where each state of the more than three EPROMs has a different on resistance value than the other states of the more than three EPROMs and circuit 124 selects the more than three EPROMs individually or in parallel to program and read up to greater than twenty six different states from EPROM bit 200.

EPROM bit 200 includes a first resistor 208, a second resistor 210, a third resistor 212, first EPROM 202, second EPROM 204, third EPROM 206, a first select transistor 214, a second select transistor 216, a third select transistor 218, and a bit address transistor 220. One end of first resistor 208 is electrically coupled to voltage supply 132 via voltage supply path 222 and the other end of first resistor 208 is electrically coupled to the drain of first EPROM 202. The gate of first EPROM 202 is electrically coupled to voltage supply 132 via voltage supply path 222 and the source of first EPROM 202 is electrically coupled to the drain of first select transistor 214. The source of first select transistor 214 is electrically coupled to the drain of bit address transistor 220 via drain path 224. The source of bit address transistor 220 is electrically coupled to a reference, such as ground, at 226. One end of second resistor 210 is electrically coupled to voltage supply 132 via voltage supply path 222 and the other end of second resistor 210 is electrically coupled to the drain of second EPROM 204. The gate of second EPROM 204 is electrically coupled to voltage supply 132 via voltage supply path 222 and the source of second EPROM 204 is electrically coupled to the drain of second select transistor 216. The source of second select transistor 216 is electrically coupled to the drain of bit address transistor 220 via drain path 224. One end of third resistor 212 is electrically coupled to voltage supply 132 via voltage supply path 222 and the other end of third resistor 212 is electrically coupled to the drain of third EPROM 206. The gate of third EPROM 206 is electrically coupled to voltage supply 132 via voltage supply path 222 and the source of third EPROM 206 is electrically coupled to the drain of third select transistor 218. The source of third select transistor 218 is electrically coupled to the drain of bit address transistor 220 via drain path 224.

Each of the first EPROM 202 and the second EPROM 204 and the third EPROM 206 has an un-programmed state and a programmed state and each state of the first EPROM 202 and the second EPROM 204 and the third EPROM 206 has a different on resistance than the other five states of the first EPROM 202 and the second EPROM 204 and the third EPROM 206. First EPROM 202 has a first un-programmed resistance and a first programmed resistance and second EPROM 204 has a second un-programmed resistance and a second programmed resistance and third EPROM 206 has a third un-programmed resistance and a third programmed resistance, where each resistance of the first un-programmed resistance, the first programmed resistance, the second un-programmed resistance, the second programmed resistance, the third un-programmed resistance, and the third programmed resistance is a different resistance value than each of the other five resistances. In one example, first EPROM 202 has a first channel width and second EPROM 204 has a second channel width and third EPROM 206 has a third channel width, where each of the first channel width and the second channel width and the third channel width is different than the other two channel widths to provide the different resistance values. In one example, at least one of the first EPROM 202 and the second EPROM 204 and the third EPROM 206 is a first type of EPROM and at least one of the first EPROM 202 and the second EPROM 204 and the third EPROM 206 is a second type of EPROM to provide the different resistance values, where different types of EPROMs include EPROM cell 90 of FIG. 3, an EPROM manufactured using the layers of EPROM chip 70 of FIG. 2 where one transistor is an EPROM transistor and another transistor operates as the control gate for the EPROM transistor, and an EPROM manufactured using another process and different layers than those of EPROM chip 70 of FIG. 2.

Circuit 124 (shown in FIG. 4) selects first EPROM 202 and second EPROM 204 and third EPROM 206 individually or in parallel to program and read the states of EPROM bit 200. To select only first EPROM 202, circuit 124 simultaneously provides a high select signal SELA at 228, a low select signal SELB at 230, a low select signal SELC at 232, and a high bit address signal BIT_ADDR at 234. To select only second EPROM 204, circuit 124 simultaneously provides a low select signal SELA at 228, a high select signal SELB at 230, a low select signal SELC at 232, and a high bit address signal BIT_ADDR at 234. To select only third EPROM 204, circuit 124 simultaneously provides a low select signal SELA at 228, a low select signal SELB at 230, a high select signal SELC at 232, and a high bit address signal BIT_ADDR at 234. To select the parallel combination of first EPROM 202 and second EPROM 204, circuit 124 simultaneously provides a high select signal SELA at 228, a high select signal SELB at 230, a low select signal SELC at 232, and a high bit address signal BIT_ADDR at 234. To select the parallel combination of first EPROM 202 and third EPROM 206, circuit 124 simultaneously provides a high select signal SELA at 228, a low select signal SELB at 230, a high select signal SELC at 232, and a high bit address signal BIT_ADDR at 234. To select the parallel combination of second EPROM 204 and third EPROM 206, circuit 124 simultaneously provides a low select signal SELA at 228, a high select signal SELB at 230, a high select signal SELC at 232, and a high bit address signal BIT_ADDR at 234. To select the parallel combination of first EPROM 202, second EPROM 204, and third EPROM 206, circuit 124 simultaneously provides a high select signal SELA at 228, a high select signal SELB at 230, a high select signal SELC at 232, and a high bit address signal BIT_ADDR at 234. In one example, circuit 124 combines row and column addresses to provide bit address signal BIT_ADDR at 234.

Circuit 124 programs first EPROM 202 and second EPROM 204 and third EPROM 206 individually. To program first EPROM 202, circuit 124 selects only first EPROM 202 and programming circuit 128 controls voltage supply 132 to provide a programming voltage V at 222 to first EPROM 202. Current flows through first resistor 208, first EPROM 202, first select transistor 214, and bit address transistor 220 to the reference at 226. To program second EPROM 204, circuit 124 selects only second EPROM 204 and programming circuit 128 controls voltage supply 132 to provide a programming voltage V at 222 to second EPROM 204. Current flows through second resistor 210, second EPROM 204, second select transistor 216, and bit address transistor 220 to the reference at 226. To program third EPROM 206, circuit 124 selects only third EPROM 206 and programming circuit 128 controls voltage supply 132 to provide a programming voltage V at 222 to third EPROM 206. Current flows through third resistor 212, third EPROM 206, third select transistor 218, and bit address transistor 220 to the reference at 226. Bit address transistor 220 conducts current from each of the first EPROM 202 and the second EPROM 204 and the third EPROM 206 via drain path 224. In other examples, circuit 124 can program parallel combinations of first EPROM 202 and second EPROM 204 and third EPROM 206.

Circuit 124 reads EPROM bit 200 by selecting and reading first EPROM 202 and second EPROM 204 and third EPROM 206 individually or in parallel. Circuit 124 selects one of the first EPROM 202, the second EPROM 204, and the third EPROM 206 or one of the parallel combinations of the first EPROM 202 and the second EPROM 204 and the third EPROM 206. Measurement circuit 130 controls voltage supply 132 to provide voltage V at 222 and measures the on resistance through the selected one of the first EPROM 202, the second EPROM 204, and the third EPROM 206 or one of the parallel combinations of the first EPROM 202 and the second EPROM 204 and the third EPROM 206. Circuit 124 assigns a corresponding state to the measured resistance value. EPROM bit 200 stores up to twenty six different states using first EPROM 202 and second EPROM 204 and third EPROM 206.

To read the different states of EPROM bit 200, a user has to know or obtain the coding scheme that indicates whether to select only first EPROM 202 or only second EPROM 204 or only third EPROM 206 or one of the parallel combinations of first EPROM 202 and second EPROM 204 and third EPROM 206. In one example, at least part of the coding scheme is fixed and known by the user, such that each bit in a fixed portion of EPROM memory 122 is read by selecting only the first EPROM or only the second EPROM or only the third EPROM or only one of the parallel combinations of the EPROMs. In one example, at least part of the coding scheme is stored in another EPROM memory or in another integrated circuit die. In one example, at least part of the coding scheme is stored on a central server that may be accessed over the internet. In one example, at least part of the coding scheme is stored in EPROM memory 122, such as in a select only the parallel combination of all three EPROMs portion of EPROM memory 122.

In other examples, one or more EPROM bits in EPROM memory 122 include more than three EPROMs, such as four or more EPROMs.

Figure 8:
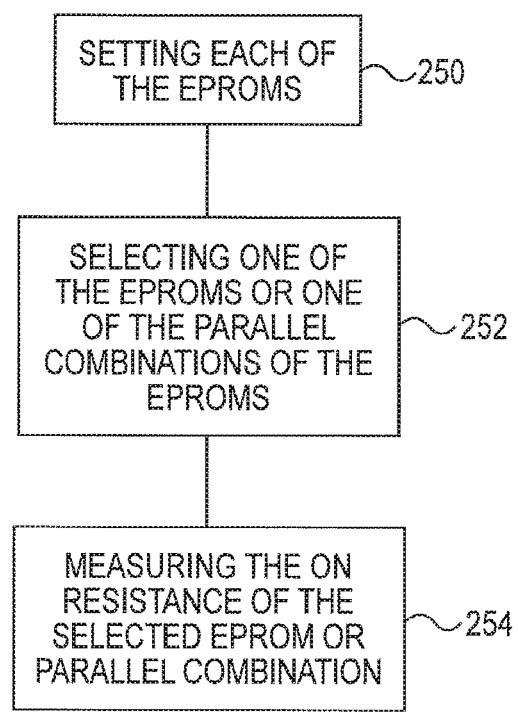
FIG. 8 is a flow chart diagram illustrating one example of multilevel EPROM encoding for an EPROM bit in an EPROM memory.

FIG. 8 is a flow chart diagram illustrating one example of multilevel EPROM encoding for an EPROM bit in EPROM memory 122 (shown in FIG. 4). The EPROM bit includes two or more EPROMs in parallel, such as in EPROM bit 140 of FIG. 5 and EPROM bit 200 of FIG. 7.

At 250, each of the EPROMs is set to one of an unprogrammed resistance and a programmed resistance, where each resistance is different than the other resistances. Next, at 252, one of the EPROMs is individually selected or one parallel combination of the EPROMs is selected. Next, at 254, the on resistance is measured through the selected one of the EPROMs or the selected parallel combination of the EPROMs.

Figure 9:
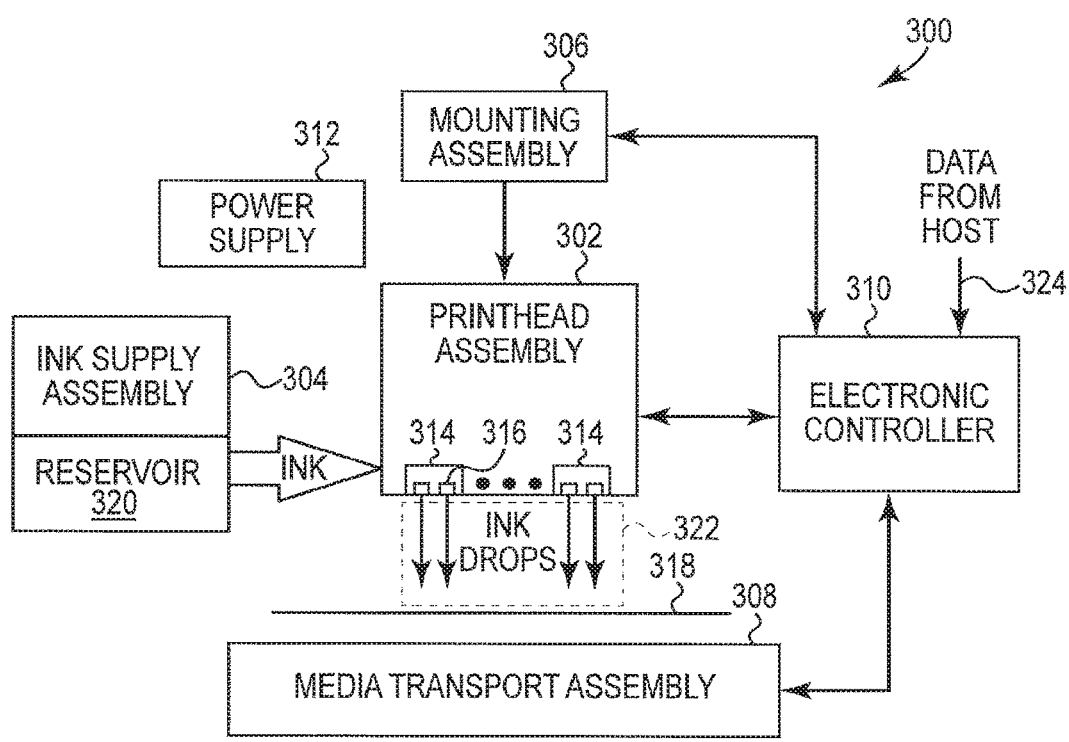
FIG. 9 is a diagram illustrating one example of an inkjet printing system that includes the system of FIG. 4.

FIG. 9 is a diagram illustrating one example of an inkjet printing system 300 that includes system 120 of FIG. 4. In one example, inkjet printing system 300 includes only EPROM memory 122. In one example, inkjet printing system 300 includes only circuit 124.

Inkjet printing system 300 constitutes one example of a fluid ejection system that includes a fluid ejection device, such as inkjet printhead assembly 302, and a fluid supply assembly, such as ink supply assembly 304. The inkjet printing system 300 also includes a mounting assembly 306, a media transport assembly 308, and an electronic controller 310. At least one power supply 312 provides power to the various electrical components of inkjet printing system 300.

In one example, inkjet printhead assembly 302 includes at least one printhead or printhead die 314 that ejects drops of ink through a plurality of orifices or nozzles 316 toward a print medium 318 so as to print onto print medium 318. Printhead 314 is one example of a fluid ejection device. Print medium 318 may be any type of suitable sheet material, such as paper, card stock, transparencies, Mylar, fabric, and the like. Typically, nozzles 316 are arranged in one or more columns or arrays such that properly sequenced ejection of ink from nozzles 316 causes characters, symbols, and/or other graphics or images to be printed upon print medium 318 as inkjet printhead assembly 302 and print medium 318 are moved relative to each other. While the following description refers to the ejection of ink from printhead assembly 302, it is understood that other liquids, fluids or flowable materials, including clear fluid, may be ejected from printhead assembly 302. In one example, at least one printhead 314 includes system 120. In one example, at least one printhead 314 includes circuit 124. In one example, at least one printhead 314 includes EPROM memory 122.

Ink supply assembly 304 as one example of a fluid supply assembly provides ink to printhead assembly 302 and includes a reservoir 320 for storing ink. As such, ink flows from reservoir 320 to inkjet printhead assembly 302. Ink supply assembly 304 and inkjet printhead assembly 302 can form either a one-way ink delivery system or a recirculating ink delivery system. In a one-way ink delivery system, substantially all of the ink provided to inkjet printhead assembly 302 is consumed during printing. In a recirculating ink delivery system, only a portion of the ink provided to printhead assembly 302 is consumed during printing. As such, ink not consumed during printing is returned to ink supply assembly 304.

In one example, inkjet printhead assembly 302 and ink supply assembly 304 are housed together in an inkjet cartridge or pen. The inkjet cartridge or pen is one example of a fluid ejection device. In another example, ink supply assembly 304 is separate from inkjet printhead assembly 302 and provides ink to inkjet printhead assembly 302 through an interface connection, such as a supply tube (not shown). In either example, reservoir 320 of ink supply assembly 304 may be removed, replaced, and/or refilled. In one example, where inkjet printhead assembly 302 and ink supply assembly 304 are housed together in an inkjet cartridge, reservoir 320 includes a local reservoir located within the cartridge and may also include a larger reservoir located separately from the cartridge. As such, the separate, larger reservoir serves to refill the local reservoir. Accordingly, the separate, larger reservoir and/or the local reservoir may be removed, replaced, and/or refilled.

Mounting assembly 306 positions inkjet printhead assembly 302 relative to media transport assembly 308 and media transport assembly 308 positions print medium 318 relative to inkjet printhead assembly 302. Thus, a print zone 322 is defined adjacent to nozzles 316 in an area between inkjet printhead assembly 302 and print medium 318. In one example, inkjet printhead assembly 302 is a scanning type printhead assembly. As such, mounting assembly 306 includes a carriage (not shown) for moving inkjet printhead assembly 302 relative to media transport assembly 308 to scan print medium 318. In another example, inkjet printhead assembly 302 is a non-scanning type printhead assembly. As such, mounting assembly 306 fixes inkjet printhead assembly 302 at a prescribed position relative to media transport assembly 308. Thus, media transport assembly 308 positions print medium 318 relative to inkjet printhead assembly 302.

Electronic controller or printer controller 310 typically includes a processor, firmware, and other electronics, or any combination thereof, for communicating with and controlling inkjet printhead assembly 302, mounting assembly 306, and media transport assembly 308. Electronic controller 310 receives data 324 from a host system, such as a computer, and usually includes memory for temporarily storing data 324. Typically, data 324 is sent to inkjet printing system 300 along an electronic, infrared, optical, or other information transfer path. Data 324 represents, for example, a document and/or file to be printed. As such, data 324 forms a print job for inkjet printing system 300 and includes one or more print job commands and/or command parameters. In one example, electronic controller 310 includes system 120. In one example, electronic controller 310 includes circuit 124. In one example, electronic controller 310 includes EPROM memory 122.

In one example, electronic controller 310 controls inkjet printhead assembly 302 for ejection of ink drops from nozzles 316. As such, electronic controller 310 defines a pattern of ejected ink drops that form characters, symbols, and/or other graphics or images on print medium 318. The pattern of ejected ink drops is determined by the print job commands and/or command parameters.

In one example, inkjet printhead assembly 302 includes one printhead 314. In another example, inkjet printhead assembly 302 is a wide-array or multi-head printhead assembly. In one wide-array example, inkjet printhead assembly 302 includes a carrier, which carries printhead dies 314, provides electrical communication between printhead dies 314 and electronic controller 310, and provides fluidic communication between printhead dies 314 and ink supply assembly 304.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:
1. A method comprising:
providing a first EPROM and a second EPROM;
selecting one of the first EPROM, the second EPROM, and a parallel combination of the first EPROM and the second EPROM; and
measuring a resistance through the selected one of the first EPROM, the second EPROM, and the parallel combination of the first EPROM and the second EPROM, wherein when the parallel combination of the first EPROM and the second EPROM is selected, the measured resistance is of a parallel resistance of the first EPROM and the second EPROM.
2. The method of claim 1, comprising:
setting the first EPROM to one of a first un-programmed resistance and a first programmed resistance; and
setting the second EPROM to one of a second un-programmed resistance and a second programmed resistance, wherein each resistance of the first un-programmed resistance, the first programmed resistance, the second un-programmed resistance, and the second programmed resistance is different than each of the other three resistances.
3. The method of claim 1, comprising:
providing a third EPROM;
selecting one of the first EPROM, the second EPROM, the third EPROM, and each parallel combination of two or more of the first EPROM and the second EPROM and the third EPROM; and
measuring a resistance through the selected one of the first EPROM, the second EPROM, the third EPROM, and each parallel combination of two or more of the first EPROM and the second EPROM and the third EPROM.
4. The method of claim 1, wherein the first EPROM and second EPROM are connected to a common node when both the first EPROM and the second EPROM are selected to select the parallel combination of the first EPROM and second EPROM.
5. The method of claim 4, further comprising:
selecting both the first EPROM and the second EPROM to select the parallel combination of the first EPROM and the second EPROM by activating select signals to gates of respective select transistors that connect the first and second EPROMs to the common node.
6. The method of claim 4, further comprising:
activating a bit address transistor that connects the common node to a reference potential, wherein the parallel resistance of the first EPROM and the second EPROM is measured based on current flow through the first EPROM and the second EPROM and through the bit address transistor.
7. The method of claim 6, wherein activating the bit address transistor is based on a bit address signal provided to a gate of the bit address transistor.
8. The method of claim 1, wherein when the first EPROM is selected but the second EPROM is not selected, the measured resistance is of a resistance of the first EPROM.
9. The method of claim 8, wherein when the second EPROM is selected but the first EPROM is not selected, the measured resistance is of a resistance of the second EPROM.
10. The method of claim 1, wherein the first EPROM is settable to a first state and a second state, the second EPROM is settable to a third state and a fourth state, and the parallel combination of the first EPROM and the second EPROM is settable to a fifth state and a sixth state.
11. The method of claim 10, wherein the first EPROM and the second EPROM form an EPROM bit that is settable to any of the first state, the second state, the third state, the fourth state, the fifth state, and the sixth state based on activating a bit address transistor that is controlled by a bit address signal.
12. The method of claim 10, wherein the first state is represented by a first resistance value, the second state is represented by a second resistance value, the third state is represented by a third resistance value, the fourth state is represented by a fourth resistance value, the fifth state is represented by a fifth resistance value, and the sixth state is represented by a sixth resistance value.
13. The method of claim 1, wherein the first EPROM is a first type of EPROM, and the second EPROM is a second type of EPROM different from the first type of EPROM.

14. The method of claim 1, wherein the first EPROM and the second EPROM are part of a printhead.

15. A method comprising:
   connecting a first EPROM cell between a voltage line and a common node;
   connecting a second EPROM cell between the voltage line and the common node;
   connecting the common node through a bit address transistor to a reference potential, wherein selection of both the first EPROM cell and the second EPROM cell provides a parallel combination of the first EPROM cell and the second EPROM cell that is connected through the bit address transistor to the reference potential.

16. The method of claim 15, further comprising:
   connecting a first transistor between the first EPROM cell and the common node, a gate of the first transistor connected to a first select signal; and
   connecting a second transistor between the second EPROM cell and the common node, a gate of the second transistor connected to a second select signal.

17. The method of claim 15, wherein the first EPROM cell when selected provides a first resistance, the second EPROM cell when selected provides a second resistance different from the first resistance, and the parallel combination of the first EPROM cell and the second EPROM cell provides a parallel resistance different from each of the first resistance and the second resistance.

18. The method of claim 15, wherein the first EPROM cell and the second EPROM cell are part of a memory bit.

19. The method of claim 15, wherein the first EPROM cell and the second EPROM cell are part of a printhead.

* * * * *